(12) United States Patent
Nam et al.

(10) Patent No.: US 6,444,375 B1
(45) Date of Patent: Sep. 3, 2002

(54) METHOD FOR MANUFACTURING A MASK

(75) Inventors: Seung-hyung Nam, Incheon; Tae-ho Jang, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/054,461

(22) Filed: Nov. 12, 2001

Related U.S. Application Data

(62) Division of application No. 09/484,626, filed on Jan. 18, 2000.

(30) Foreign Application Priority Data

Feb. 18, 1999 (KR) .............................................. 99-5384

(51) Int. Cl.⁷ ................................................. G03F 9/00
(52) U.S. Cl. .............................................. 430/5; 430/30
(58) Field of Search ....................................... 430/5, 30

(56) References Cited

U.S. PATENT DOCUMENTS 6,361,907 B1 * 3/2002 Nam et al. .................... 430/22

* cited by examiner

*Primary Examiner*—Christopher G. Young
(74) *Attorney, Agent, or Firm*—Cantor Colburn LLP

(57) ABSTRACT

An exposing method comprises use of different kinds of aligning and exposing apparatuses having different alignment and exposure characteristics. Capability to select a suitable aligning and exposing apparatus for each layer to be formed is accomplished by manufacturing a mask used for the exposure to be compatible with different kinds of aligning and exposing apparatuses.

3 Claims, 5 Drawing Sheets

METHOD FOR MANUFACTURING A MASK

CROSS REFERENCE TO RELATED APPLICATIONS

This application is a divisional application of U.S. Pat. No. 09/484,626, filed on Jan. 18, 2000, which is herein incorporated by reference in its entirety.

BACKGROUND OF THE INVENTION

1. Field of the Invention

The present invention relates to a method for manufacturing a semiconductor device, and more particularly, to an exposing method in which different kinds of aligning and exposing apparatuses are used.

2. Description of the Related Art

As a semiconductor technology develops, the integration of semiconductor devices continues to increase. This means that the number of semiconductor devices integrated into the area of a substrate, that is, the density of semiconductor devices, increases, and that the distance between the semiconductor devices becomes narrower.

Semiconductor devices are formed on a substrate by a photolithography process and an etching process. In the photolithography process, a pattern to be formed is transferred onto the substrate. The photolithography process can be divided into a step of coating the substrate with a photosensitive film, an aligning and exposing step of aligning an exposing apparatus with respect to the coated photosensitive film and exposing the photosensitive film, and developing the exposed photosensitive film. A mask pattern is formed by the development step. In the etching process, a material film formed on the substrate is patterned using the mask pattern as an etching mask. By doing so, the pattern defined on the substrate by the mask pattern is transferred onto the substrate.

It can be seen that in the above processes the characteristics of the pattern formed on the substrate, for example, the line width of the pattern and the distance between the patterns are already determined in the process of forming the mask pattern. This is because the etching process is only a process of transferring the pattern etched into the mask pattern to the material film formed on the substrate using the formed mask pattern as an etching mask.

Therefore, increasing the integration of the semiconductor devices requires narrowing the width of the pattern formed in the mask pattern and the distance between the patterns in the process of forming the mask pattern.

The characteristics of the mask pattern are determined in the aligning and exposing step. In this step, the characteristics of the pattern formed in the mask pattern can be affected by the characteristics of the photosensitive film or the environment. However, the characteristics of the pattern are affected more by the aligner and exposer apparatuses used for alignment and exposure. Also, since overlap precision or the resolution of the exposer can vary according to an aligning and exposing method even though the same aligner and exposer apparatuses are used, the characteristics of the pattern are significantly affected by the aligning and exposing method.

Different types of aligning and exposing methods include a contact method, a proximity method, a reflective-type projection method, and a reducing projection lens method. Among the above methods, the contact method and the proximity method are restrictively used only in a process where there is some room in an overlap margin, due to problems caused by the contact of the mask pattern to the photosensitive film and problems resulting from resolution deterioration due to a diffraction phenomenon.

The reflective-type projection method and the reducing projection lens method, which are scan methods, or step and repeat methods, are widely used, since the overlap precision and the resolution are higher than in the contact method and the proximity method. However, as semiconductor devices become more highly integrated, the resolution and the overlap precision required by a design rule exceed the resolution and the overlap precision of the aligner and exposer apparatuses used for the reflective-type projection method and the reducing projection lens method. Accordingly, an aligner and an exposer having higher resolution and overlap precision than those of the aligner and exposer apparatuses used for the reflective-type projection method and the reducing projection lens method are required. Accordingly, production costs of the more highly integrated semiconductor devices are expected to increase, as the effectiveness and efficiency of the aligner and exposer apparatuses used for the reflective-type projection method and the reducing projection lens method are diminished by the increased design rule demands.

SUMMARY OF THE INVENTION

To solve the above problem, it is an object of the present invention to provide an exposing method by which production costs of highly integrated semiconductor devices are minimized by the effective and efficient use of conventional aligning and exposing apparatuses.

Accordingly, to achieve the above object, there is provided an exposing method which comprises a photolithography process of forming a material layer on a substrate, coating the material layer with a photosensitive film, and patterning the photosensitive film to restrict the material layer, in order to form a material layer pattern having a desired shape on the substrate, wherein the photosensitive film is patterned using aligning and exposing apparatuses selected from different kinds of aligning and exposing apparatuses, each having different exposing characteristics according to the specific requirements of the particular material layer pattern.

For example, in manufacturing a semiconductor device according to the present invention, where the material layer pattern is an interlayer dielectric film including a contact hole, the photosensitive film pattern formed to restrict the contact hole on the interlayer dielectric film can be formed using a stepper type aligning and exposing apparatus. Where the material layer pattern is a pad layer connected to the substrate through the contact hole formed on the interlayer dielectric film, the photosensitive film pattern formed to restrict the pad layer can be formed using a scanner type aligning and exposing apparatus having an exposing characteristic less precise than the exposing characteristic of the stepper type aligning and exposing apparatus. To provide compatibility, the photosensitive film pattern for restricting the contact hole is formed using a mask including the alignment characteristic of the scanner type aligning and exposing apparatus. Likewise, the photosensitive film pattern for restricting the pad layer is formed using a mask including the alignment characteristics of another aligning and exposing apparatus. The alignment key of the scanner type aligning and exposing apparatus is engraved on the mask of the stepper type aligning and exposing apparatus. Stepper type aligning and exposing apparatuses having different reducing projection ratios are used as one selected from the different kinds of aligning and exposing apparatuses. At least two-stepper type aligning and exposing apparatuses having different reducing projection ratios are selected from the group consisting of stepper type aligning and exposing apparatuses whose projection ratios are 1:1, 2.5:1, and 5:1. The stepper-type aligning and exposing apparatus and the scanner type aligning and exposing apparatus are used as the different kinds of aligning and exposing apparatuses. The stepper-type aligning and exposing apparatus used is one selected from the group consisting of stepper-type aligning and exposing apparatuses whose projection ratios are 1:1, 2.5:1, and 5:1.

According to an embodiment of the present invention, the different kinds of exposing apparatuses selected to be used for a photolithography process are preferably determined by the following evaluation steps:

(a) resolution and precision capabilities of each aligning and exposing apparatus to be used for the photolithography process is assessed; (b) design rule and the overlay margin requirements of a layer to be formed by the photolithography process are investigated and evaluated; (c) aligning and exposing apparatus for the layer to be formed is selected on the basis of the ability of the aligning and exposing apparatus, the investigation, and the evaluation.

Based on the selected aligning and exposing apparatuses, a mask (or a reticle) to be used for the photolithography process is manufactured. Alignment keys for each different kind of aligning and exposing apparatus are all included in the manufactured mask.

Preferably, the mask should be manufactured so that image matching between the different kinds of aligning and exposing apparatuses can be performed. The largest scribe line between those of the different kinds of aligning and exposing apparatuses should be adopted as a scribe line. A wafer array preferably is adopted so that alignment can be performed between the different kinds of aligning and exposing apparatuses.

In the present invention, different kinds of aligning and exposing apparatuses having different exposure capabilities are used in the photolithography process. It is possible to select a suitable aligning and exposing apparatus for each layer to be formed by manufacturing the mask used for exposure to be compatible with different kinds of aligning and exposing apparatuses. By doing so, it is possible to use an aligning and exposing apparatus having a relatively less precise exposure characteristics together with an exposing apparatus having high resolution and alignment precision. Therefore, it is possible to reduce the necessity of additionally introducing an aligning and exposing apparatus having excellent exposure characteristics. In this manner, a high production cost structure is replaced with a low production cost structure, and the utility and productivity of the retained aligning and exposing apparatuses are maximized.

BRIEF DESCRIPTION OF THE DRAWINGS

The above object and advantages of the present invention will become more apparent by the following detailed description of preferred embodiments thereof with reference to the attached drawings in which.

In the attached drawings, the thicknesses of various films and areas are exaggerated for the clarity of the specification. The same reference numerals denote the same members in each of the respective figures.

DESCRIPTION OF THE PREFERRED EMBODIMENTS

Hereinafter, an exposing method using a mix and match technology of different kinds of exposing apparatuses according to embodiments of the present invention will be described in detail with reference to the attached drawings.

Various semiconductor elements which constitute a semiconductor device are formed by repeatedly stacking and patterning multiple material layers. Material layers are patterned by a photolithography process and an etching process. A patterned material layer is obtained by directly transferring a photosensitive film pattern formed in the photolithography process onto a substrate. Therefore, process characteristics such as design rules and alignment margin, which restrict the patterning of the material layer, are determined in the photolithography process.

In the process of manufacturing the semiconductor device, the process characteristics such as the design rule and the alignment precision of the material layer to be patterned vary according to material layers. Therefore, it is possible to use an exposing apparatus having relatively low resolution and alignment precision for some material layers of the device, even though it is true that the need for exposing apparatuses having higher resolution and alignment precision increases as the semiconductor device becomes more highly integrated.

In an exposing method by the present invention, an aligning and exposing apparatus having less precise alignment and exposure characteristics is used together with an aligning and exposing apparatus having excellent alignment and exposure characteristics. In order to facilitate understanding of the invention, one embodiment of the exposing method according to the present invention, as applied to a process of manufacturing a capacitor of a semiconductor device, will be provided below.

Figure 1:
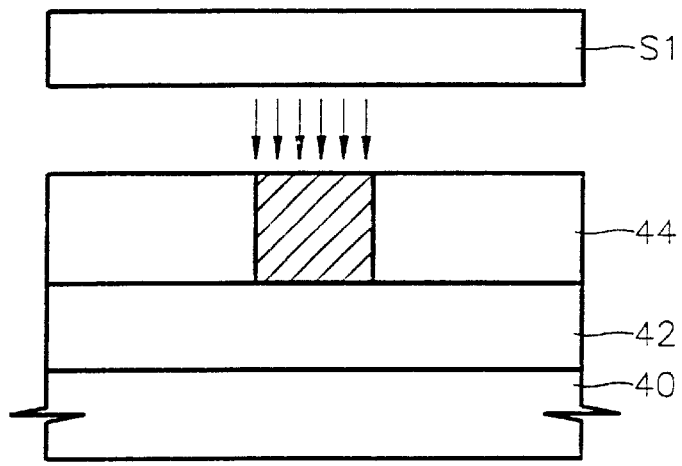
FIGS. 1 through 13 are sectional views illustrating each step of a method for manufacturing a capacitor of a semiconductor device comprising an exposing method using different kinds of aligning and exposing apparatuses according to embodiments of the present invention.

Referring to FIG. 1, a first interlayer dielectric film 42 is formed on a substrate 40. Although not shown, a semiconductor device such as a transistor can be previously formed between the substrate 40 and the first interlayer dielectric film 42. The first interlayer dielectric film 42 is coated with a first photosensitive film 44. After aligning a first aligning and exposing apparatus S1 above the first photosensitive film 44, a region covering the part limited by the contact hole forming region of the first interlayer dielectric film 42 is exposed in the first photosensitive film 44. In the first photosensitive film 44, a part marked with oblique lines is exposed. The exposed part is removed by developing the first photosensitive film 44.

Figure 2:
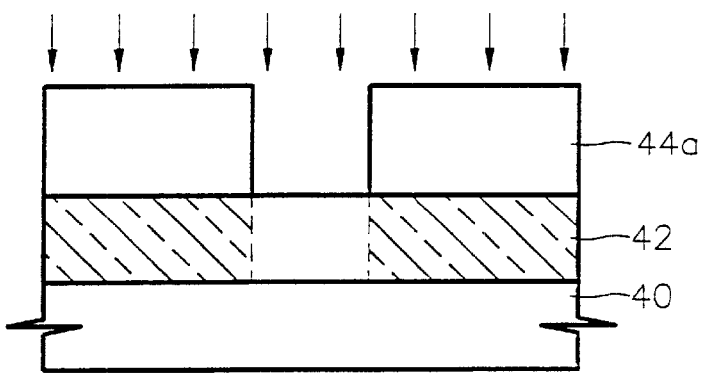

As a result, as shown in FIG. 2, a first photosensitive film pattern 44a exposing the contact hole forming region of the first interlayer dielectric film 42 is formed on the first interlayer dielectric film 42. A region in which the contact hole is to be formed is marked with the dotted lines of the first interlayer dielectric film 42.

Considering that the semiconductor device will become more highly integrated, the contact hole to be formed in the first interlayer dielectric film 42 is preferably formed in a position which is as accurate as possible. Accordingly, the first photosensitive film pattern 44a should be formed to accurately expose the part defined as the contact hole forming region in the first interlayer dielectric film 42. This means that the alignment margin is low in the process of forming the first photosensitive film pattern 44a. Therefore, a stepper type aligning and exposing apparatus having high resolution and alignment precision is preferably used as the first aligning and exposing apparatus used for the photolithography process for forming the first photosensitive film pattern 44a. For example, it is preferable that the stepper type aligning and exposing apparatus is a stepper type aligning and exposing apparatus whose projection ratio is 1:1, 2.5:1, or 5:1.

Figure 3:
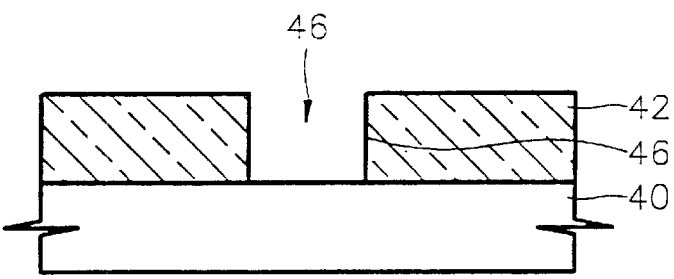

Referring to FIG. 3, the exposed part of the first interlayer dielectric film 42 is etched by, for example, dry etching using the first photosensitive film pattern 44a as an etching mask. Here, the etching is performed until the substrate 40 is exposed. The first photosensitive film pattern 44a is removed. As a result, a first contact hole 46 exposing the substrate 40 is formed in the first interlayer dielectric film 42.

Figure 4:
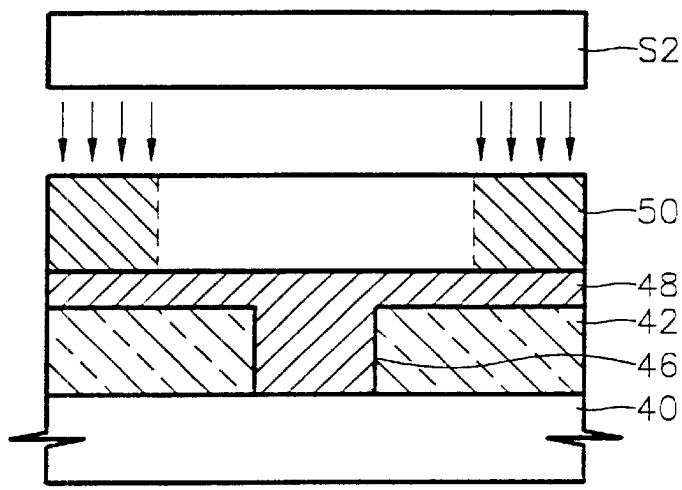

Referring to FIG. 4, a first conductive layer 48 which fills the first contact hole 46 is formed on the first interlayer dielectric film 42 including the first contact hole 46. Since the first conductive layer 48 is to be used as a pad layer, the first conductive layer is preferably formed of a conductive material layer having a low contact resistance such as an aluminum layer or a silicide layer. The first conductive layer 48 is coated with a second photosensitive film 50. After aligning a second aligning and exposing apparatus S2 on the second photosensitive film 50, the second photosensitive film is exposed. In the second photosensitive film 50, the part (shown by hatching) exposed by the second aligning and exposing apparatus S2 covers the region of the first conductive layer 48 which is not to be formed as the pad layer. The part exposed by the second aligning and exposing apparatus S2 is removed by developing the second photosensitive film 50.

Figure 5:
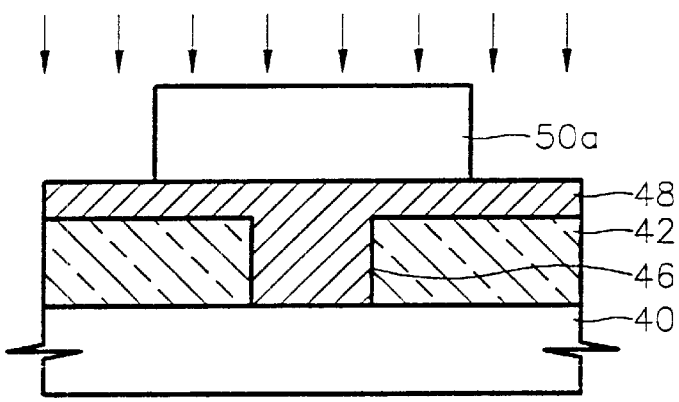

Referring to FIG. 5, by the development, a second photosensitive film pattern 50a for covering the pad layer forming region of the first conductive layer 48 is formed on the first conductive layer 48. The region covered by the second photosensitive film pattern 50a includes a part of the first conductive layer 48 which covers both some of the first interlayer dielectric film 42 around the first contact hole 46 and the first contact hole 46. Since it is preferable that the region to be used as the pad layer is formed to be as wide as possible without contacting other adjacent pad layers, in the photolithography process for forming the second photosensitive film pattern 50a, the alignment margin is larger than in the photolithography process for forming the first photosensitive film pattern 44a. Therefore, an aligning and exposing apparatus having lower resolution and alignment precision than those of the first aligning and exposing apparatus S1 can be used as the second aligning and exposing apparatus S2. Therefore, the second photosensitive film pattern 50a is preferably formed using a scanner type aligning and exposing apparatus having lower resolution and alignment precision than those of a stepper-type aligning and exposing apparatus.

Figure 6:
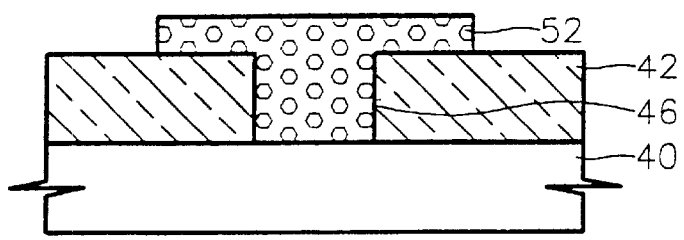

The overall exposed surface of the second conductive layer 48 is anisotropically etched, using the second photosensitive film pattern 50a as the etching mask, until the first interlayer dielectric film 42 is exposed. Then, the second photosensitive film pattern 50a is removed. As a result, as shown in FIG. 6, a pad layer 52 connected to the substrate 40 is formed. The pad layer 52 is a pattern of the first conductive layer 48.

The system and alignment key system of the scanner-type aligning and exposing apparatus are different from those of the stepper-type aligning and exposing apparatus. However, pursuant to the present invention, different kinds of aligning and exposing apparatuses can be used in forming the first and second photosensitive film patterns 44a and 50a, since a mask suitable for the photolithography process using the different kinds of aligning and exposing apparatuses is formed prior to forming the first and second photosensitive film patterns 44a and 50a.

Figure 7:
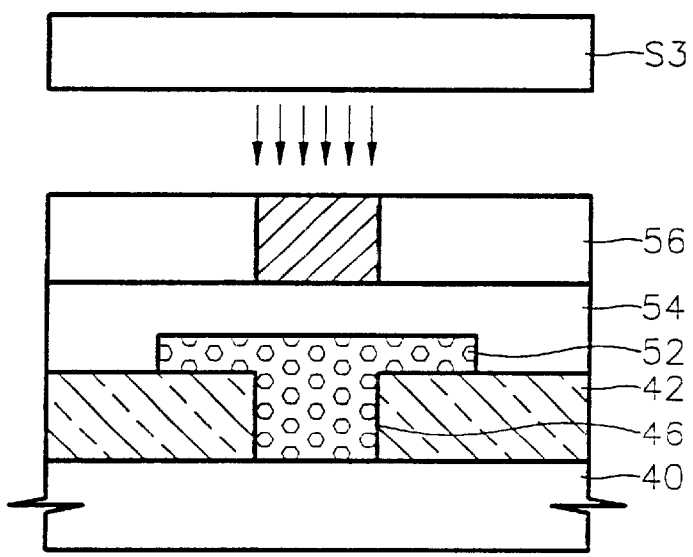

Referring to FIG. 7, a second interlayer dielectric film 54 is formed on the first interlayer dielectric film 42 on which the pad layer 52 is formed. After planarizing the second interlayer dielectric film 54, the entire surface of the second interlayer dielectric film 54 is coated with a third photosensitive film 56. After baking the third photosensitive film 56, a third aligning and exposing apparatus S3 is aligned over the third photosensitive film 56. The defined area of the third photosensitive film 56 is exposed using the third aligning and exposing apparatus S3. In the third photosensitive film 56, the part (shown by hatching) exposed by the third aligning and exposing apparatus S3 is a part of the second interlayer dielectric film 54 formed on the pad layer 52. In the third photosensitive film 56, the part exposed by the third aligning and exposing apparatus S3 is developed and removed.

Figure 8:
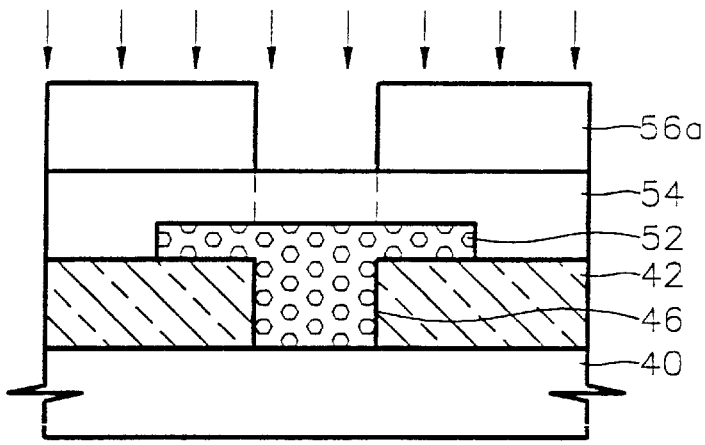

As a result, a third photosensitive film pattern 56a, through which the part of the second interlayer dielectric film 54 formed on the pad layer 52 is exposed, is formed as shown in FIG. 8.

Since the third photosensitive film pattern 56a is used as an etching mask in a process of forming a contact hole through which the pad layer 52 is exposed in the second interlayer dielectric film 54, the photolithography process by which the third photosensitive film pattern 56a is formed has high resolution and alignment precision. Namely, the alignment margin of the photolithography process is small. Therefore, it is preferable to use a different kind of aligning and exposing apparatus, which has a higher resolution and alignment precision than the scanner type aligning and exposing apparatus, for example, the stepper type aligning and exposing apparatus, as the third aligning and exposing apparatus S3. It is most preferable to use the stepper type aligning and exposing apparatus having a projection ratio of 1:1. However, the stepper type aligning and exposing apparatus having the projection ratio of about 2.5:1 or 5:1 can also be used.

Figure 9:
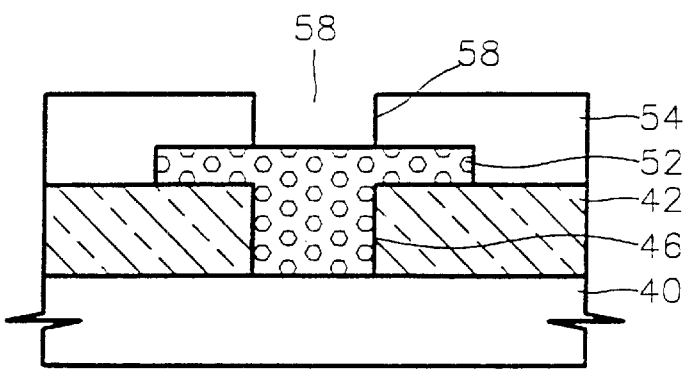

The exposed part of the second interlayer dielectric film 54 is anisotropically etched using the third photosensitive film pattern 56a as the etching mask. The anisotropic etching is performed until the pad layer 52 is exposed. Then, the third photosensitive film pattern 56a is removed. As a result, a second contact hole 58 through which the pad layer 52 is exposed is formed in the second interlayer dielectric film 54 as shown in FIG. 9.

Figure 10:
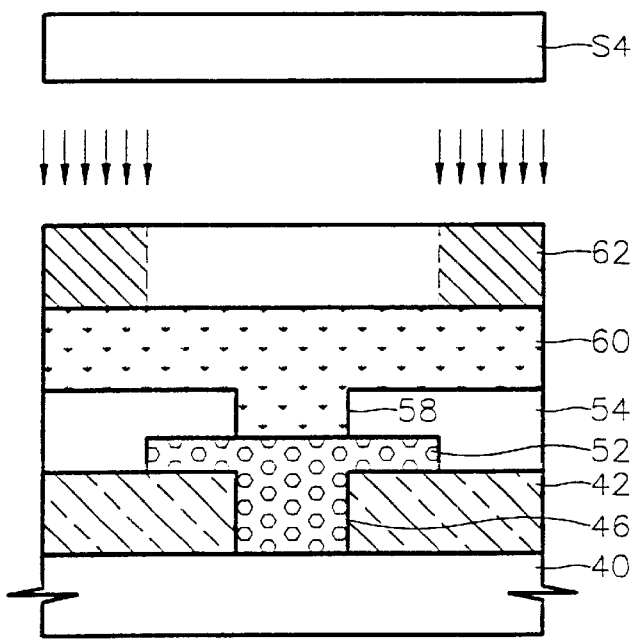
Figure 11:
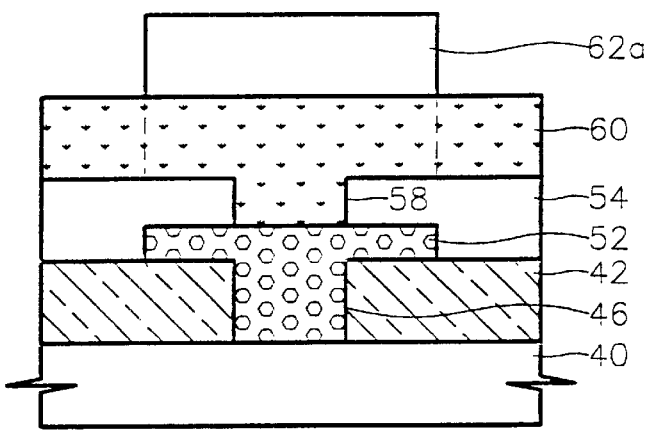

Referring to FIG. 10, a second conductive layer 60 for filling the second contact hole 58 is formed on the second interlayer dielectric film 54. The second conductive layer 60 is coated with a fourth photosensitive film 62. After baking the fourth photosensitive film 62, a fourth aligning and exposing apparatus S4 is aligned on the fourth photosensitive film 62. The part of the fourth photosensitive film 62 defined by hatching is exposed using the fourth aligning and exposing apparatus S4. The exposed part of the fourth photosensitive film 62 covers an area of the second conductive layer 60 which covers the second interlayer dielectric film 54 around the second contact hole 58. When the exposed part is removed by developing the fourth photosensitive film 62, as shown in FIG. 11, a fourth photosensitive film pattern 62a which covers the second contact hole 58 and an area of the second conductive layer 60 around the second contact hole 58 is formed. The fourth photosensitive film pattern 62a is used as the etching mask for patterning the second conductive layer 60. Namely, the fourth photosensitive film pattern is used as the etching mask for forming a conductive layer line.

In the process of manufacturing the semiconductor device, a process of forming a metal line has a larger alignment margin than other processes. Therefore, an aligning and exposing apparatus having relatively lower resolution and alignment precision than the resolution and alignment precision of the aligning and exposing apparatus used when the photosensitive film pattern for forming the contact hole is formed, can be used in the photolithography process for forming the fourth photosensitive film pattern 62a. Therefore, it is preferable to use a different kind of aligning and exposing apparatus, which has a lower resolution and alignment precision than the stepper type aligning and exposing apparatus, for example, the scanner type aligning and exposing apparatus as the fourth aligning and exposing apparatus S4. In order to do this, information required for aligning the mask of the fourth aligning and exposing apparatus S4 is engraved on the mask according to the above-mentioned processes when the mask of the third aligning and exposing apparatus S3 is manufactured.

Since the alignment key and the wafer array of the fourth aligning and exposing apparatus S4 are included in the information, it is possible to form the fourth photosensitive film pattern 62a using the fourth aligning and exposing apparatus S4, based on the information.

Figure 12:
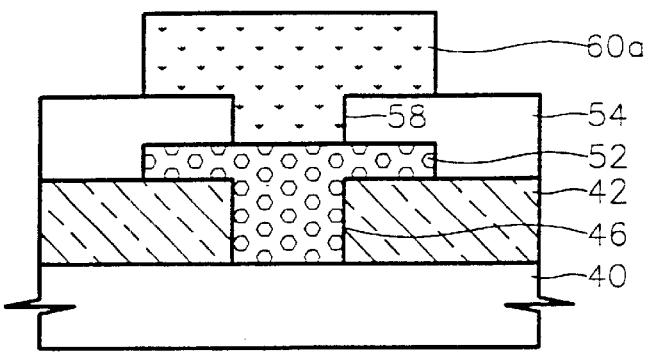

Referring to FIG. 11, the overall exposed surface of the second conductive layer 60 is anisotropically etched using the fourth photosensitive film pattern 62a as the etching mask. Then, the fourth photosensitive film pattern 62a is removed. As a result, as shown in FIG. 12, a second conductive layer pattern 60a which contacts the pad layer 52 through the second contact hole 58 is formed on the second interlayer dielectric film 54. The second conductive layer pattern 60a can be a bit line or an interconnection line. However, here, the second conductive layer pattern 60a is considered to be the lower electrode of a capacitor.

Figure 13:
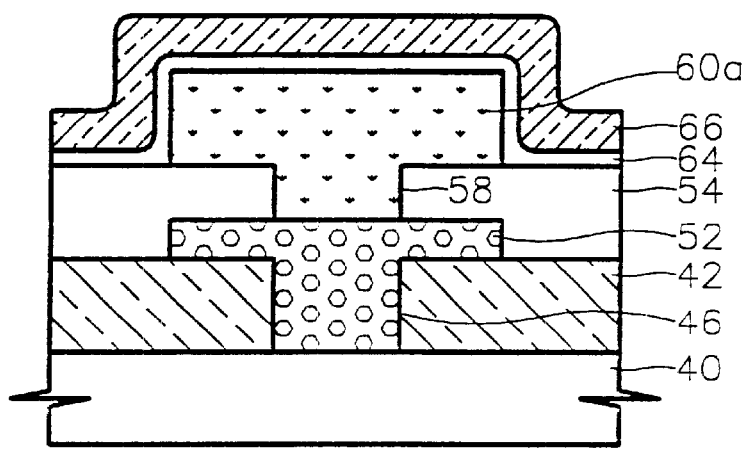

As shown in FIG. 13, the capacitor is completed by forming a dielectric film 64 and an upper conductive layer 66 on the second conductive layer pattern 60a.

Figure 14:
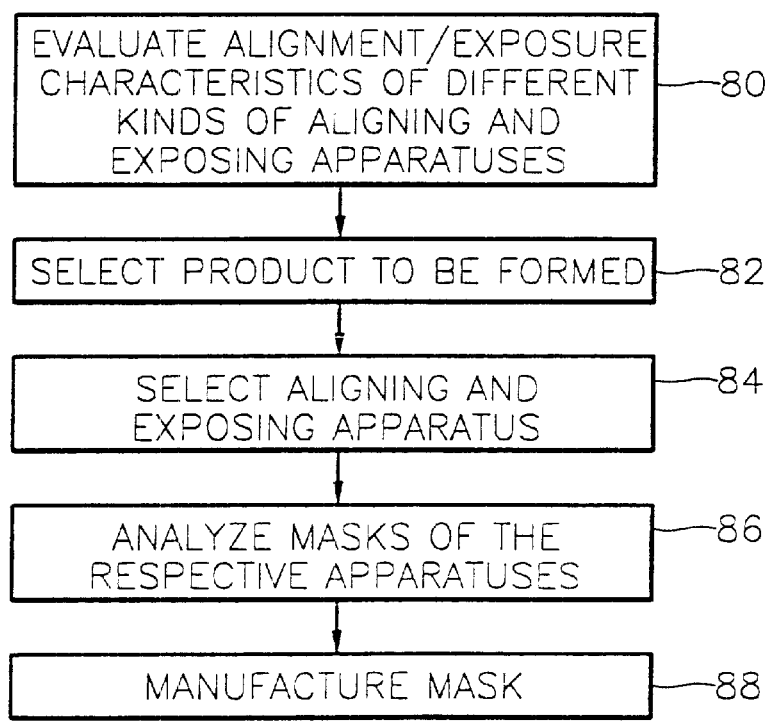
FIG. 14 is a block diagram illustrating each step of a method for manufacturing a mask used for the subject exposing method using the different kinds of aligning and exposing apparatuses according to the embodiments of the present invention.

Referring to FIG. 14, in the first step 80, the alignment and exposure characteristics such as the resolution and alignment precision of different aligning and exposing apparatuses to be used in the photolithography process using the different kinds of aligning and exposing apparatuses are investigated and evaluated.

Here, stepper type aligning and exposing apparatuses having different projection ratios are used as the different kinds of aligning and exposing apparatuses. For example, two stepper type aligning and exposing apparatuses selected from the stepper type aligning and exposing apparatuses whose projection ratios are 1:1, 2.5:1, and 5:1 are used as the different kinds of aligning and exposing apparatuses. Also, one selected from the above stepper type aligning and exposing apparatuses (for example, the stepper type aligning and exposing apparatus whose projection ratio is 1:1) and the scanner type aligning and exposing apparatus are preferably used as the different kinds of aligning and exposing apparatuses.

In the second step 82, a product to be formed is selected. When the product to be formed is selected, it is investigated and evaluated how many masks or reticles are required for forming the product. And design rules and alignment margins for the respective masks are investigated and evaluated.

In the third step 84, aligning and exposing apparatuses which are suitable for the masks are selected on the basis of the evaluation results of the first and second steps 80 and 82.

To be specific, the aligning and exposing apparatuses having different alignment and exposure characteristics are selected according to whether a mask is for forming a photosensitive film pattern to form the contact hole or for forming a photosensitive film pattern to form a pattern having a larger design rule or alignment margin than in the process of forming the contact hole, for example, the pad layer.

In the fourth step 86, the masks to be used for the different kinds of aligning and exposing apparatuses are analyzed.

To be specific, when the aligning and exposing apparatuses are chosen with respect to the respective masks, the masks should be manufactured considering the aligning and exposing apparatuses used for prior and aligning and exposing apparatuses to be used for post processes. For this, the characteristics of the masks of the aligning and exposing apparatuses used for the prior and to be used for post processes such as the field regions of the masks or the positions or shapes of the alignment keys to be formed into the masks are analyzed. For example, the characteristics of the mask for the stepper type aligning and exposing apparatus and the characteristics of the mask of the scanner type aligning and exposing apparatus are analyzed. Since the mask to be used for the photolithography process in which one selected from the different kinds of aligning and exposing apparatuses is used should include all the characteristics of the masks of both apparatuses used for prior process and to be used for post processes, it is necessary to analyze the characteristics of the masks of the respective apparatuses.

In the fifth step 88, the mask to be used for the photolithography process in which one selected from the different kinds of aligning and exposing apparatuses is used is manufactured.

To be specific, the mask to be used for the photolithography process in which the different kinds of aligning and exposing apparatuses are used is manufactured on the basis of the analysis result with respect to the characteristics of the masks of the different kinds of aligning and exposing apparatuses. In the process of manufacturing the mask, it is preferable to consider alignment keys, scribe lines, and wafer arrays and image matching between the different kinds of aligning and exposing apparatuses, for example, the stepper type and scanner type exposing apparatuses. The mask is preferably manufactured to include the above. Therefore, in the mask to be manufactured, the image is preferably formed in units of a field which is repeated in stages. All the alignment keys required by the different kinds of aligning and exposing apparatuses are preferably formed in desired positions. Among the scribe lines for the different kinds of aligning and exposing apparatuses, the scribe line having the best broad width is preferably defined in the mask. The wafer array preferably has a pattern in which all the different kinds of aligning and exposing apparatuses can be aligned.

As mentioned above, the first photosensitive film pattern 44a and the second photosensitive film pattern 50a are sequentially formed by exposing and developing the first and second photosensitive films 44 and 50 using the mask manufactured through the above processes and the different kinds of aligning and exposing apparatuses. Therefore, the mask of the stepper type exposing apparatus used for forming the first photosensitive film pattern 44a is formed to include the characteristics, for example, the alignment key, the scribe line, and the wafer array required by the mask of the scanner type aligning and exposing apparatus used for forming the second photosensitive film pattern 50a. Accordingly, the mask of the stepper type exposing apparatus used for the photolithography process for forming the first photosensitive film pattern 44a includes the scribe line which has been changed to be suitable for the scribe line included in the mask of the scanner type aligning and exposing apparatus and the alignment key of the scanner type aligning and exposing apparatus. Also, the horizon align marks (HAMS) of the field are reconstituted so that the zone having a high practical use among the HAMS is first arranged and on the right and left sides of the center of the field in positions which are symmetrical with respect to right and left HAMS. Here, the number of horizontal chips arranged in the field should be even number. Also, the alignment keys of the scanner type aligning and exposing apparatus are preferably arranged in a multi zone pattern so as to compensate for the asymmetry of the distances from the center of the wafer thereto as the layout of the wafer changes.

The mask of the scanner type aligning and exposing apparatus used for the photolithography process for forming the second photosensitive film pattern 50a is preferably formed to include all the characteristics of the mask of the stepper type aligning and exposing apparatus according to the above-mentioned processes when the stepper type exposing apparatus is used for the next process. Here, it is preferable that a pattern generation (PG) basic cell of the mask of the scanner type aligning and exposing apparatus is the entire field of the mask of the successive stepper type aligning and exposing apparatus.

A method for approaching the wafer varies according to the difference in the mechanical systems of different kinds of aligning and exposing apparatuses. For example, how sense the center of the wafer varies according to the difference in the mechanical systems. Due to these differences, an offset array is generated between the different kinds of aligning and exposing apparatuses. The different kinds of aligning and exposing apparatuses are made to sense the same position of the wafer as the center by appropriately adjusting the offset array. Wafer processing using the different kinds of aligning and exposing apparatuses is performed by the above processes.

In the above, various items are described in detail. However, they should be considered for showing preferred embodiments, not for restricting the scope of the present invention. While this invention has been particularly shown and described with reference to preferred embodiments thereof, it will be understood by those skilled in the art that various changes in form and details may be made therein without departing from the spirit and scope of the invention as defined by the appended claims. For example, anyone skilled in the art can apply the exposing method using different kinds of aligning and exposing apparatuses not only to a process of manufacturing a capacitor of a semiconductor device but also to other processes such as a process of forming a high voltage transistor and a process of forming a multi-layer bonding pad. The compatibility between the scanner type aligning and exposing apparatus and the stepper type aligning and exposing apparatus having the projection ratio of 1:1 was mainly mentioned in the description of the exposing method using the different kinds of aligning and exposing apparatuses. However, it is apparent to anyone skilled in the art that exposure using aligning and exposing apparatuses other than the scanner type aligning and exposing apparatus and the stepper type aligning and exposing apparatus having the projection ratio of 1:1 can be performed by controlling the above-mentioned method for constituting the mask and the system of the aligning and exposing apparatus as mentioned in the middle of this specification. Therefore, the scope of the present invention should be determined not by the above embodiments but by the spirit of the invention which is described in the claims.

As mentioned above, in the present invention, different kinds of aligning and exposing apparatuses having different exposure performances are used for the photolithography process. Here, it is possible to select a suitable aligning and exposing apparatus for each layer to be formed by manufacturing the mask used for the exposure to be compatible with different kinds of aligning and exposing apparatuses. By doing so, it is possible to use an aligning and exposing apparatus having a relatively poor exposing characteristic together with an exposing apparatus having excellent resolution and alignment precision. Therefore, the need for additionally introducing an aligning and exposing apparatus having excellent exposing characteristics is reduced. Accordingly, it is possible to convert a high expense production structure to a low expense production structure and to maximize the utility and productivity of the retained aligning and exposing apparatuses.

What is claimed is:

1. A method for manufacturing a mask to be used in an exposing method for producing multiple material layers of a semiconductor device comprising:

evaluating precision characteristics of different aligning and exposing apparatuses;

assessing precision requirements for the material layers of the semiconductor device to be manufactured;

selecting suitable apparatuses from the different aligning and exposing apparatuses to meet the requirements for each of the multiple material layers of the semiconductor device;

analyzing mask characteristics required for use with each selected aligning and exposing apparatus; and fabricating a mask incorporating the required mask characteristics of each of the selected different apparatuses so that the mask may be used with each of the different apparatuses.

2. The method of claim 1, wherein the alignment and exposing apparatuses are stepper type aligning and exposing apparatuses.

3. The method of claim 1, wherein the alignment and exposing apparatuses are scanner-type aligning and exposing apparatuses.

* * * * *